(12) United States Patent
Rinkiö et al.

(10) Patent No.: US 9,631,928 B2
(45) Date of Patent: Apr. 25, 2017

(54) GYROSCOPE STRUCTURE AND GYROSCOPE WITH IMPROVED QUADRATURE COMPENSATION

(71) Applicant: MURATA MANUFACTURING CO., LTD., Nagaokakyo-shi, Kyoto (JP)

(72) Inventors: Marcus Rinkiö, Rajamäki (FI); Anssi Blomqvist, Helsinki (FI); Jaakko Ruohio, Helsinki (FI)

(73) Assignee: MURATA MANUFACTURING CO., LTD., Kyoto (JP)

( * ) Notice: Subject to any disclaimer, the term of this patent is extended or adjusted under 35 U.S.C. 154(b) by 238 days.

(21) Appl. No.: 14/481,969

(22) Filed: Sep. 10, 2014

(65) Prior Publication Data

US 2015/0082885 A1 Mar. 26, 2015

(30) Foreign Application Priority Data

Sep. 11, 2013 (FI) .................................. 20135916

(51) Int. Cl.
*G01C 19/5712* (2012.01)
*G01C 19/5755* (2012.01)
(Continued)

(52) U.S. Cl.
CPC ............ *G01C 19/5712* (2013.01); *B81B 7/02* (2013.01); *G01C 19/5755* (2013.01); *G01C 19/5776* (2013.01)

(58) Field of Classification Search
CPC .. B81B 7/02; G01C 19/5712; G01C 19/5755; G01C 19/5776
See application file for complete search history.

(56) References Cited

U.S. PATENT DOCUMENTS 5,600,065 A * 2/1997 Kar ..................... G01C 19/5719
73/504.02
5,992,233 A * 11/1999 Clark ................. G01C 19/5719
361/280
(Continued)

FOREIGN PATENT DOCUMENTS

| EP | 1 619 471 A1 | 1/2006 |
| WO | WO 2008/072008 A1 | 6/2008 |
| WO | WO 2009/050578 A2 | 4/2009 |

OTHER PUBLICATIONS

Finnish Search Report dated May 16, 2014 corresponding to Finnish Patent Application No. 20135916.
(Continued)

*Primary Examiner* — David Bolduc
(74) *Attorney, Agent, or Firm* — Squire Patton Boggs (US) LLP

(57) ABSTRACT

A microelectromechanical gyroscope structure that comprises a seismic mass, a body element, and a spring structure suspending the seismic mass to the body element. In primary oscillation at least part of the seismic mass oscillates in out-of-plane direction. A first conductor is arranged to move with the seismic mass, and a second conductor is attached to the body element. The conductors include adjacent surfaces that extend in the first direction and the third direction. A voltage element is arranged to create between the first surface and the second surface a potential difference and thereby induce an electrostatic force in the second direction and modulated by the primary oscillation of the seismic mass.

19 Claims, 6 Drawing Sheets

(51) Int. Cl.
*G01C 19/5776* (2012.01)
*B81B 7/02* (2006.01)

(56) References Cited

U.S. PATENT DOCUMENTS

| | | | | |
|---|---|---|---|---|
| 6,070,463 A * | 6/2000 | Moriya | G01C 19/5719 | 73/504.02 |
| 6,250,156 B1 * | 6/2001 | Seshia | G01C 19/5719 | 73/504.12 |
| 6,611,168 B1 * | 8/2003 | Denison | H01G 5/16 | 330/4.5 |
| 6,668,649 B2 * | 12/2003 | Ishitoko | G01C 19/5663 | 73/504.12 |
| 7,036,372 B2 * | 5/2006 | Chojnacki | G01C 19/5747 | 73/504.12 |
| 7,213,458 B2 * | 5/2007 | Weber | G01C 19/5719 | 73/504.12 |
| 7,287,428 B2 * | 10/2007 | Green | G01C 19/574 | 73/504.12 |
| 7,950,281 B2 * | 5/2011 | Hammerschmidt | G01C 19/5719 | 73/504.04 |
| 8,047,075 B2 * | 11/2011 | Nasiri | G01P 15/125 | 73/510 |
| 2001/0045127 A1 * | 11/2001 | Chida | G01C 19/5719 | 73/504.12 |
| 2001/0047687 A1 * | 12/2001 | Abe | G01C 19/5607 | 73/504.16 |
| 2002/0189354 A1 * | 12/2002 | Durante | G01C 19/5747 | 73/504.12 |
| 2003/0033850 A1 | 2/2003 | Challoner et al. | | |
| 2003/0037614 A1 * | 2/2003 | Nguyen | G01P 15/0802 | 73/504.14 |
| 2004/0149035 A1 * | 8/2004 | Acar | B81B 3/0062 | 73/504.12 |
| 2005/0150297 A1 * | 7/2005 | Ayazi | G01C 19/5719 | 73/504.16 |
| 2006/0010978 A1 * | 1/2006 | Lee | G01C 19/5747 | 73/504.02 |
| 2006/0032309 A1 * | 2/2006 | Caminada | G01C 19/5726 | 73/514.18 |
| 2006/0037396 A1 * | 2/2006 | Nicu | G01C 19/5747 | 73/504.12 |
| 2006/0156813 A1 | 7/2006 | Blomqvist | | |
| 2006/0272411 A1 | 12/2006 | Acar et al. | | |
| 2007/0180907 A1 * | 8/2007 | Krieg | G01C 19/5712 | 73/504.11 |
| 2008/0092652 A1 * | 4/2008 | Acar | G01P 15/125 | 73/504.02 |
| 2009/0260437 A1 * | 10/2009 | Blomqvist | G01C 19/5712 | 73/504.12 |
| 2010/0122576 A1 | 5/2010 | Classen et al. | | |
| 2011/0154898 A1 * | 6/2011 | Cazzaniga | G01C 19/5747 | 73/504.12 |
| 2012/0216612 A1 * | 8/2012 | Seeger | G01C 19/5719 | 73/504.12 |
| 2013/0019680 A1 * | 1/2013 | Kittilsland | G01C 19/5712 | 73/504.12 |
| 2013/0269469 A1 * | 10/2013 | Rocchi | G01C 19/04 | 74/5 F |
| 2014/0144232 A1 * | 5/2014 | Lin | B81B 3/0051 | 73/504.12 |

OTHER PUBLICATIONS

Huikai Xie et al., "Fabrication, Characterization, and Analysis of a DRIE CMOS-MEMS Gyroscope," IEEE Sensors Journal, Oct. 2003, vol. 3, No. 5, pp. 622-631.

Jongpal Kim et al., "An X-Axis Single-Crystalline Silicon Microgyroscope Fabricated by the Extended SBM Process," Journal of Microelectromechanical Systems, Jun. 2005, vol. 14, No. 3, pp. 444-455.

International Search Report application No. PCT/IB2014/064375 dated Dec. 18, 2014.

* cited by examiner

GYROSCOPE STRUCTURE AND GYROSCOPE WITH IMPROVED QUADRATURE COMPENSATION

BACKGROUND

Field

The present invention relates to microelectromechanical devices and especially to a gyroscope structure and a gyroscope, as defined in the preambles of the independent claims.

Description of the Related Art

Micro-Electro-Mechanical Systems, or MEMS can be defined as miniaturized mechanical and electro-mechanical systems where at least some elements have a mechanical functionality. Since MEMS devices are created with the same tools used to create integrated circuits, micromachines and microelectronics can be fabricated on the same piece of silicon to enable machines with intelligence.

MEMS structures can be applied to quickly and accurately detect very small changes in physical properties. For example, a microelectromechanical gyroscope can be applied to quickly and accurately detect very small angular displacements. Motion has six degrees of freedom: translations in three orthogonal directions and rotations around three orthogonal axes. The latter three may be measured by an angular rate sensor, also known as a gyroscope. MEMS gyroscopes use the Coriolis Effect to measure the angular rate. When a mass is moving in one direction and rotational angular velocity is applied, the mass experiences a force in orthogonal direction as a result of the Coriolis force. The resulting physical displacement caused by the Coriolis force may then be read from, for example, a capacitively, piezoelectrically or piezoresistively sensing structure.

In MEMS gyros the primary motion is typically not continuous rotation as in conventional ones due to lack of adequate bearings. Instead, mechanical oscillation may be used as the primary motion. When an oscillating gyroscope is subjected to an angular motion orthogonal to the direction of the primary motion, an undulating Coriolis force results. This creates a secondary oscillation orthogonal to the primary motion and to the axis of the angular motion, and at the frequency of the primary oscillation. The amplitude of this coupled oscillation can be used as the measure of the angular rate.

Gyroscopes are very complex inertial MEMS sensors. The basic challenge in gyroscope designs is that the Coriolis force is very small and therefore the generated signals tend to be minuscule compared to other electrical signals present in the gyroscope. Spurious resonances and susceptibility to vibration plague many MEMS gyro designs.

One challenge in gyroscope design is quadrature error motion. In an ideal gyroscope structure, the primary oscillation and the secondary oscillation are exactly orthogonal. However, in practical devices imperfections occur, causing direct coupling of the primary mode displacement of the seismic mass to the secondary mode of the gyroscope. This direct coupling is called the quadrature error. The phase difference between the angular motion signal and the quadrature signal is 90 degrees, which means that basically the quadrature error could be eliminated with phase sensitive demodulation. However, the quadrature signal can be very large in comparison with the angular motion signal, and may therefore cause unreasonable dynamic range requirements for the readout electronics or phase accuracy of the phase demodulation.

One known method to deal with this error source is electrostatic quadrature cancellation that removes the error signal at the sensor structure, before the quadrature signal is generated. For this, an electrostatic force, exactly in-phase with the primary oscillation and parallel to the secondary oscillation may be applied to the seismic mass. FIG. 1 illustrates a prior art configuration for electrostatic quadrature suppression, introduced in the U.S. Pat. No. 5,992,233. FIG. 1 shows a seismic proof mass with two fingers projecting from opposite sides of the seismic proof mass. Each of the projecting fingers are surrounded by right and left fingers of a stationary electrode, and a small voltage differential is applied between the right finger and left finger of each pair of fingers. An opposite voltage potential may be applied between a right finger and a corresponding left finger such that this voltage difference creates a balancing force to counteract the quadrature error.

This principle is not, however, applicable for gyroscope structures where the primary mode oscillation of a seismic mass is in out-of-plane direction. MEMS devices are typically layered structures where a gyroscope structure is suspended to an underlying or covering body element. It is easily understood that fabrication of a prior art surrounding stationary electrode configuration to provide the necessary compensating voltage differential in a temperature robust manner would be challenging, or even impossible.

SUMMARY

The object of the present invention is to design a gyroscope structure that allows efficient quadrature compensation for gyroscope structures with one or more planar masses that are excited in out-of-plane direction. The objects of the present invention are achieved with a gyroscope structure according to the characterizing portions of the independent claims.

The claims define a microelectromechanical gyroscope structure that comprises a seismic mass, at least one body element, and a spring structure that suspends the seismic mass to the body element. In primary oscillation at least part of the seismic mass oscillates in a first direction and in secondary oscillation at least part of the seismic mass moves in a second direction that is perpendicular to the first direction. The seismic mass comprises a surface plane that extends planarly in the second direction and in the third direction. A first conductor is arranged to move with the seismic mass, and it includes a first surface that extends on the seismic mass in the first direction and a third direction, wherein the third direction is perpendicular to the first direction and the second direction. A second conductor is attached to the body element and includes a second surface that extends in the first direction and the third direction, and adjacent to the first surface. A voltage element is arranged to create between the first surface and the second surface a potential difference and thereby induce an electrostatic force that is in the second direction and is modulated by the primary oscillation of the seismic mass.

The claims define also a gyroscope that includes the microelectromechanical gyroscope structure. The preferred embodiments of the invention are disclosed in the dependent claims.

The present invention is based on arranging alongside of an oscillating seismic mass a planar surface and alongside of static electrode a corresponding parallel surface, and placing these surfaces adjacent to each other. An electrostatic force is then created between the plates such that during the primary motion the area of the overlap of the two surfaces changes, and the electrostatic force becomes modulated according to the change. The electrostatic force eliminates unwanted in-plane movement during the primary oscillation and the oscillation of the seismic mass becomes accurately aligned to the desired out-of-plane motion.

Further advantages of the invention are discussed in more detail with the following embodiments.

BRIEF DESCRIPTION OF THE DRAWINGS

In the following the invention will be described in greater detail, in connection with preferred embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of gyroscope structures that are generally known to a person skilled in the art may not be specifically described herein.

Figure 2A:
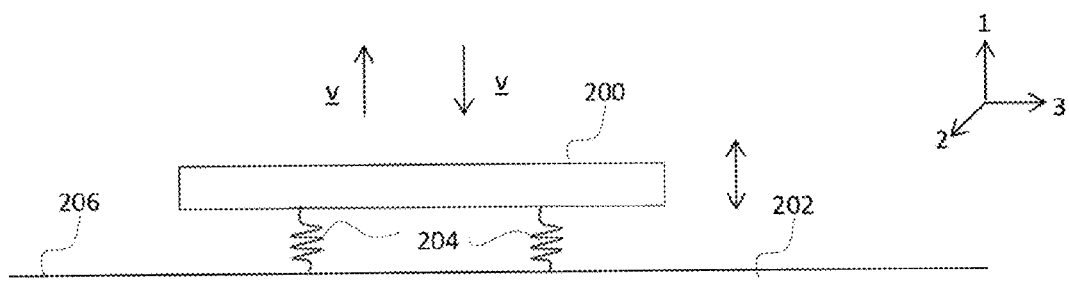
FIGS. 2A and 2B show exemplary microelectromechanical gyroscope structures.
Figure 2B:
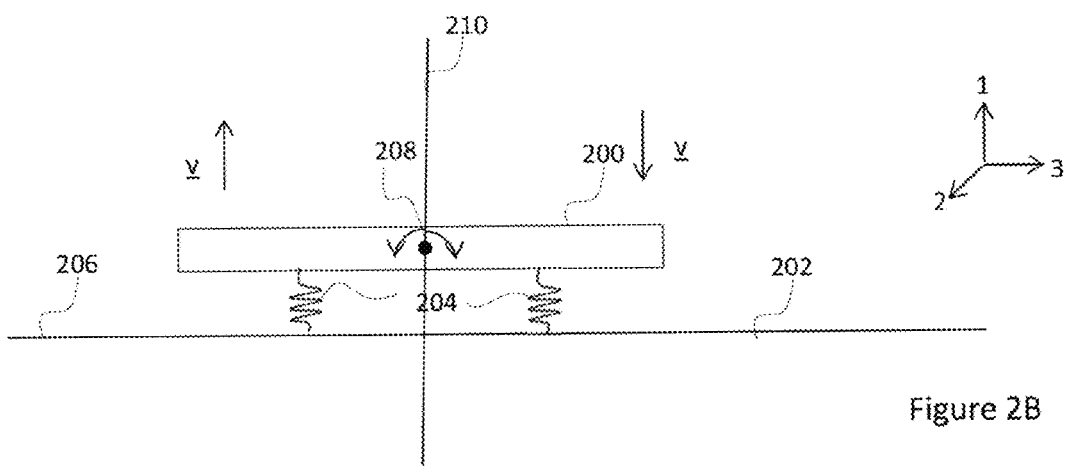

The invention is applicable for any gyroscope structure that comprises at least one seismic mass configured to undergo out-of-plane primary motion. FIGS. 2A and 2B illustrate basic concepts and directions applied in the description of the invention. FIGS. 2A and 2B show exemplary microelectromechanical gyroscope structures that comprise a seismic mass 200 and a body element 202. The term seismic mass refers here to a mass body that may be suspended to another structure to provide an inertial movement in response to forces acting on it. The gyroscope structure includes also a spring structure 204 for suspending the seismic mass 200 on the body element 202 of the gyroscope. The body element may be provided, for example, by an underlying handle wafer, or a covering cap wafer of a gyroscope die. It is noted that the divisions to the structure wafer, the handle wafer and the cap wafer are conceptual. For a person skilled in the art it is clear, for example, that the handle wafer and the structure wafer may be patterned separately or in combination from a layered silicon-insulator-silicon substrate. The seismic mass may be suspended to one or more body elements.

The spring structure 204 is configured to suspend the seismic mass 200 in such a way that it allows the seismic mass to undergo out-of-plane primary oscillation in which at least part of the seismic mass 200 moves in a first direction 1 away from the body element. Out-of-plane movement may include rotary oscillation of the seismic mass where opposite ends of a planar seismic mass twist in a see-saw type of movement away from the body part and towards it. On the other hand, out-of-plane movement may include linear oscillation of the seismic mass where a planar seismic mass vibrates linearly away from the body part and towards it. Out-of-plane movement may also include buckling of the seismic mass where a planar seismic mass bends between two parallel axes such that distal ends of the seismic mass move to one direction while the proximal part of the seismic mass between the parallel axes moves to another direction.

In an out-of-plane oscillation of a seismic mass at least part of the seismic mass moves away from the plane of suspension 206 in the body part. A layer of the body element 202 may be considered a plane of suspension 206, and in the primary oscillation the velocity v (underlining used in the text as vector notation) of at least some part of the seismic mass has a component perpendicular to the plane of suspension 206. FIG. 2A illustrates a configuration where the spring structure suspends the seismic mass to linear out-of-plane oscillation that is perpendicular to the plane of suspension 206. In such a case the velocity v of any part of the seismic mass has a component perpendicular to the plane of suspension 206. FIG. 2B illustrates a configuration where the spring structure suspends the seismic mass to rotational out-of-plane oscillation about a rotation axis 208 that is parallel to the plane of suspension 206. In such a case the velocity v of a point of the seismic mass that coincides with the axis of rotation 208 is zero, but the velocity of any other part of the seismic mass in primary motion has a component $v_1$ perpendicular to the plane of suspension 206. Other forms of out-of-plane motion where a part of the seismic mass has a component perpendicular to the plane of suspension may be applied, as well.

It is noted that for simplicity, in the example of FIG. 2 the body element 202 is shown as an underlying substrate and the plane of suspension is considered to be aligned with the planar outer surface of the substrate. Such configurations are easy to manufacture, but in view of the invention, the body part does not need to be planar and the plane of suspension does not need to be the outer surface of the substrate. Any planar or textured layer within the plane of the seismic mass, or within the underlying or covering body part, perpendicular to which the primary oscillation may take place, is applicable as the plane of suspension 206.

When the seismic mass is excited to the out-of-plane primary oscillation in the first direction, angular motion of the seismic mass about an axis perpendicular to the first direction causes a Coriolis force that displaces the seismic mass in a direction that is perpendicular to the first direction and the angular motion axis. In the exemplary configuration of FIGS. 2A and 2B, the displacements due to the Coriolis force take place in the second direction 2. In FIG. 2A, the Coriolis force causes the seismic mass to vibrate linearly in the second direction 2. In FIG. 2B, the Coriolis force induces the seismic mass to oscillate about a rotary axis 210 in the first direction 1 such that velocity of at least part of the seismic mass has a component in the second direction 2. The angular motion may thus be measured by detecting the movement of the seismic mass in the second direction 2.

The gyroscope structure typically include excitation means (not shown) that are configured to drive the seismic mass 200 to the out-of-plane primary motion. The excitation means may include a conductor, a mass electrode that is configured to move with the seismic mass 200 and interact electrically with a static electrode or electrodes attached to the body element 202. As a result of controlled electrical interaction the excitation means may induce the seismic mass 200 into out-of-plane oscillation in respect of the body element 202. It is understood that various excitation structures capable of creating the specified out-of-plane directed electrical excitation force to a seismic mass may be applied within the scope. For example, the excitation means may comprise an electrode layer region patterned on a surface of the seismic mass. Alternatively, the seismic mass may itself be formed of conductive material. Also piezoelectrical excitation may be applied by e.g. a piezoelectric film deposited on top of a layer forming springs that suspend the seismic mass.

In order to reduce or eliminate error caused by unintentional deviations in the primary oscillation, a modulated electrical force may be induced to the seismic mass by means of at least two conductors. A first conductor is arranged to move along movements of the seismic mass, and a second conductor is arranged to be static in relation to the body element and adjacent to the first conductor. A potential difference may be provided between the first conductor and the second conductor, whereby an electric field develops between the conductors and creates a balancing force against movements of the seismic mass in the second direction.

The balancing force must not disrupt the sensed movement of the seismic mass, so it has to be exactly simultaneous to the compensated deviations and proportional to them only. In order to achieve this in a structure with out-of-plane primary motion, the surfaces of the conductors may be arranged to extend planarly in the first direction and the third direction, and be adjacent to each other, but separated by a non-zero distance. If a potential difference is created between the surfaces, they form a capacitor in which the electrostatic force between the two charged surfaces is proportional to the overlapping area between the surfaces. The positioning of the surfaces allows the extent of the overlapping area to change along the out-of-plane primary motion of the seismic mass, and direct the balancing force correctly, without the prior art opposite conductor pairs above and below the seismic mass. It is easily understood that such element configuration would be very difficult, or at least costly to fabricate to these primary and secondary oscillation modes, and their operation would be very vulnerable to changes in temperature.

Figure 3A:
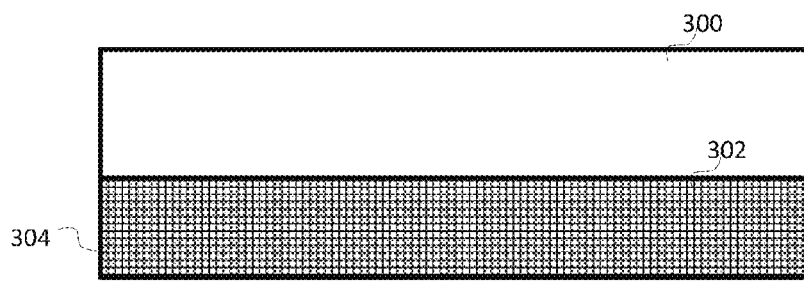
FIGS. 3A and 3B illustrate the electric force modulation during use with the structure of 2B.
Figure 3B:
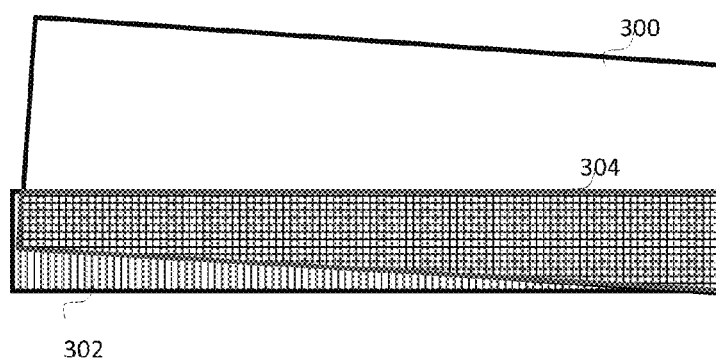

FIGS. 3A and 3B illustrate the electric force modulation during use with the structure of 2B where the primary motion is out-of-plane rotary oscillations. In this example, the seismic mass extends planarly and rectilinearly between two surfaces (top and bottom surface) along the second and the third direction, and has side surface that extend planarly along the first and the third direction. A first surface 300 may be formed of an electrode layer region positioned on a side surface of the seismic mass, i.e. the a surface of the seismic mass that extends planarly along the first and the third direction. On the other hand, the seismic mass may itself be formed of conductive material, or the seismic mass may be covered with a layer of conductive material such that the whole side surface of the seismic mass acts as the first surface. The second conductor may be included or fixedly attached to the body element, here the underlying substrate, and include a second surface that extends adjacent to the first surface. FIGS. 3A and 3B illustrate the positions of the first surface 300 and the second surface 302 in this stage of primary oscillation. FIG. 3A is a side view of the gyroscope structure of FIG. 2B at zero point of primary oscillation when the overlap is in the maximum, and FIG. 3B shows the same surfaces during some other stage of the primary oscillation.

As shown in FIG. 3A, at the zero point, the first surface 300 and the second surface 302 are completely opposite to each other and the overlap area 304 of the surfaces equals to the area of the smaller surface, here the second surface 302. As will be discussed later on, the area of the first surface 300 may be smaller, larger, or equal to the area of the second surface 302. When the seismic mass moves in the out-of-plane direction, as shown in FIG. 3B, the overlap area 304 between the first surface 300 and the second surface reduces, and modulates the balancing electrostatic force between them. The voltage difference between the surfaces may be adjusted to an applicable level by calibration. Calibration methods are well known to a person skilled in the art, and will not be discussed in more detail herein.

It is easily understood that the balancing force created by these surface orientations may be smaller than in the prior art in-plane oscillating configurations. However, it has been noted that for the dimensions applied in microelectromechanical gyroscope structures, applicable quadrature signal compensation may be achieved with this configuration that is much more easily manufactured and temperature robust.

Figure 4:
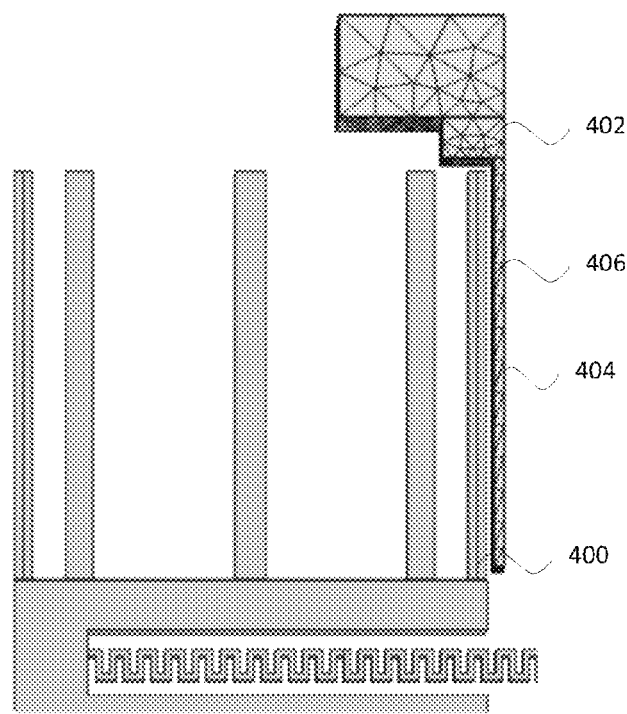
FIG. 4 provides a top view to an exemplary quadrature compensation element.

FIG. 4 provides a top view to an exemplary quadrature compensation element applicable in a gyroscope structure of FIG. 2B. The quadrature compensation element comprises a first conductor 400 arranged to move with the seismic mass. The first conductor 400 may be implemented with an electrically conducting layer of material deposited on the first seismic mass, or the first seismic mass, or a relevant part of it may have high enough conductivity to act as an electrode. In this example, the first conductor 400 is a beam-formed element protruding from the seismic mass.

The quadrature compensation element comprises also a second conductor 402 that may be attached to an underlying body element and thus remains stable during the primary motion of the first seismic mass. The second conductor 402 may also have a beam-formed structure. In order to create an appropriately directional electrostatic force in the second direction 2, the first conductor 400 includes a first surface 404, and the second conductor includes a second surface 406 and the surfaces 404, 406 are arranged into adjacent position. The term adjacent refers here to an initial mutual position of the first conductor 400 and the second conductor 402, i.e. when the first seismic mass is only suspended (no primary or secondary motion) to the body element. When a voltage difference exists between the first conductor 400 and the second conductor 402, an electric field in the second direction 2 is formed between the surface 404, 406.

The quadrature compensation element may include also a direct current bias voltage source (not shown) that is connected at least to the second conductor 402. The first conductor 400 the second conductor 402, and the direct current bias voltage source may thus be connected to jointly generate an electrostatic force that is parallel to the direction of the secondary oscillation and modulated by the primary oscillation of the seismic mass. The first surface 404 of the first conductor 400 and the second surface 406 of the second conductor 402 can be considered to form parallel plates that build up a capacitance associated with the electric fields.

Figure 5A:
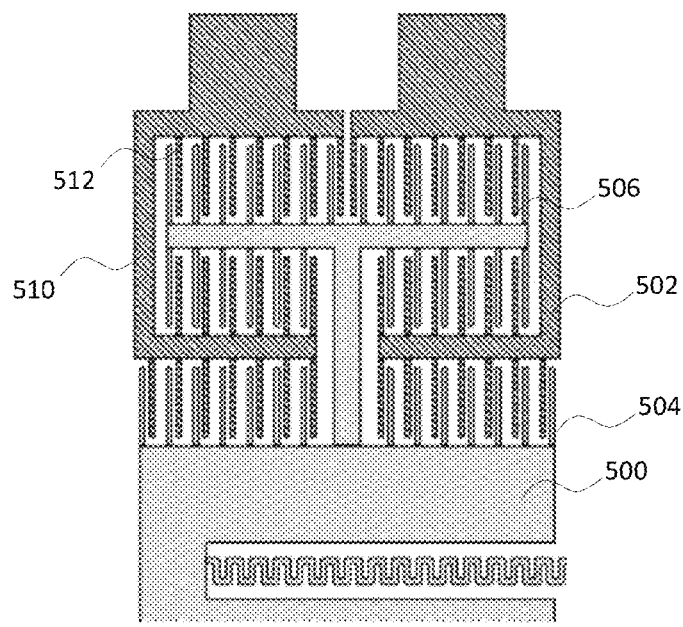
FIGS. 5A and 5B illustrate two examples of different comb structures.
Figure 5B:
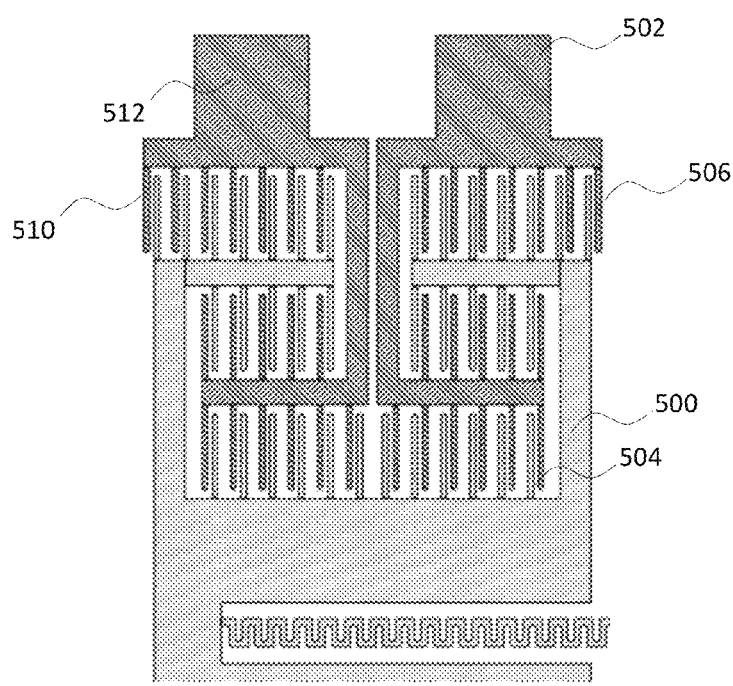

In a minimum, a gyroscope structure may be configured with one pair of conductors, one to the seismic mass to provide therein a surface that extends in the out-of-plane direction, and one anchored to the body element to provide therein an adjacent parallel surface. The balancing force may, however, be increased by applying two or more electrode pairs, arranged into an interdigital comb, a fingerlike periodic pattern of elongated beam-formed elements. FIGS. 5A and 5B illustrate two examples of different comb structures. The seismic mass 500 may include a first plurality of elongated beams 504 that are supported by from the seismic mass and extend to the third direction 3 therefrom. The structure may include also a second electrode 502 that is anchored to a body element, for example, a substrate or a cap layer. The second electrode 502 may include a second plurality of elongated beams 506, manufactured to be parallel to the first plurality of elongated beams 504 of the seismic mass. During operation, a common voltage potential may be created between the first plurality of elongated beams 504 and the second plurality of elongated beams 508. This multiplies the available balancing force in the configuration in a minimum space. It also averages potential manufacturing inaccuracies in the form of the elongated beams of the seismic mass or the second conductor.

As shown in FIGS. 5A and 5B, the gyroscope structure may comprise a further second electrode 510 that may include a third plurality of elongated beams 512, manufactured to be parallel to the first plurality of elongated beams 504 of the seismic mass, but arranged to generate an electrostatic force that is opposite to the electrostatic force generated between the first plurality of elongated beams 504 of the seismic mass and the second plurality of elongated beams 508.

It is noted that even if the comb structures of FIGS. 5A and 5B are disclosed in connection with the gyroscope structure of FIG. 2B, they are correspondingly applicable to gyroscope structures of 2A, where primary motion is linear out-of-plane oscillation.

Figure 6:
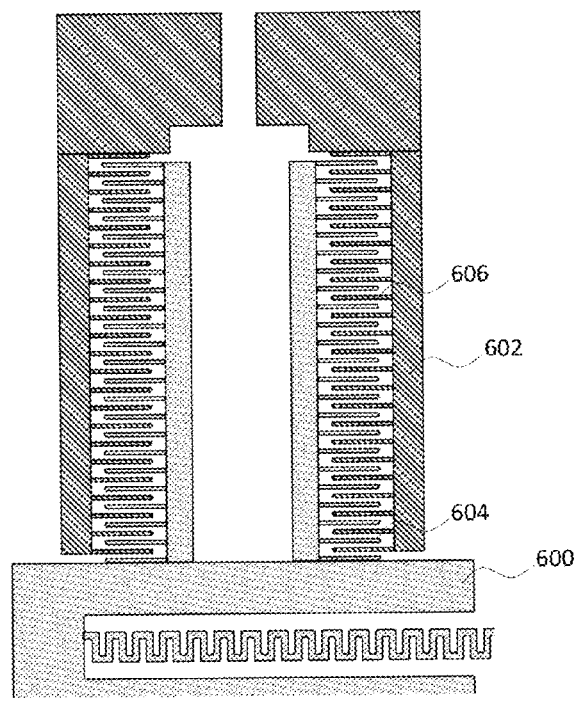
FIG. 6 illustrates a further comb configuration for the gyroscope structure.

FIG. 6 illustrates a further comb configuration for the gyroscope structure. FIG. 6 shows the first conductor 600, the second conductor 602, the plurality of elongated beams 604 of the first conductor, and the plurality of elongated beams 606 of the second conductor, introduced in FIGS. 5A and 5B. Microelectromechanical structures typically apply closing gap combs (parallel plate capacitor) or linear combs (longitudinal capacitor). In closing gap combs (cf. FIGS. 5A and 5B) the in-plane capacitance behavior of the comb fingers can be approximately modeled by a parallel plate capacitor with varying finger gap and constant area. In linear combs (cf. FIG. 6), comb fingers move in-plane parallel to each other and capacitance behavior can be modeled by a parallel plate capacitor with varying area and constant finger gap. In a capacitive transducer system, stiffness of a parallel plate capacitor characterizes how the system behaves around the equilibrium point and provides the effective spring constant for the system. A voltage biased parallel plate capacitor may reduce the system stiffness by effectively reducing a restoring spring force. In a linear comb, the capacitance changes linearly with the displacement so that the force acting on the capacitor does not depend on the displacement, and the comb drive capacitance does not introduce spring forces. With the linear comb configuration of FIG. 6, the electrostatic spring effect can be effectively eliminated from the quadrature compensation element.

Figure 7:
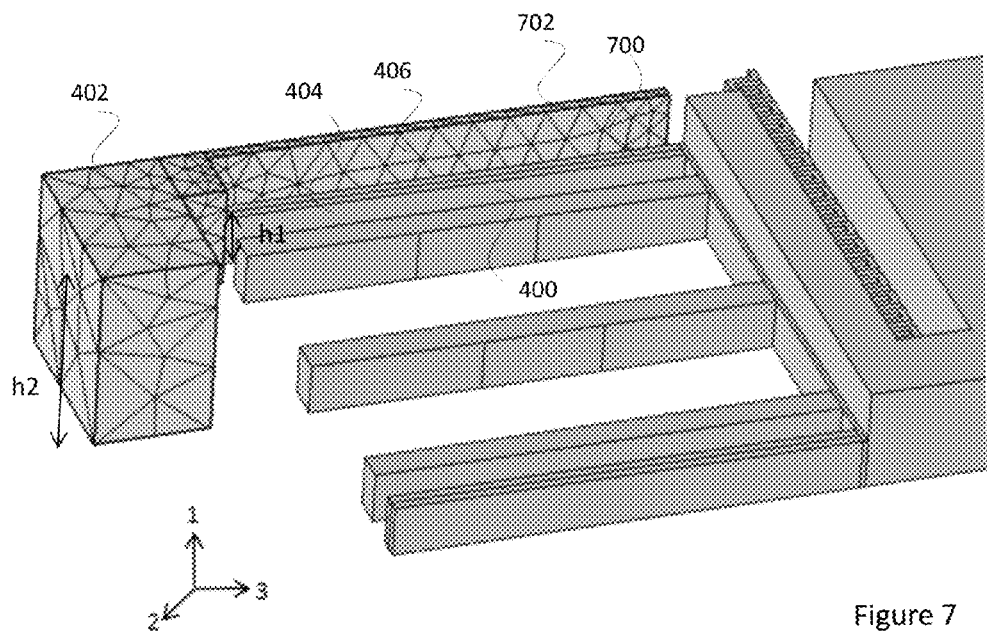
FIG. 7 illustrates a perspective side view of the compensation element of FIG. 4.

In order to enable correct modulating frequency for the electrostatic field, the extent of areas of the first and second surfaces may be different from each other. FIG. 7 illustrates a perspective side view of the compensation element of FIG. 4. It is seen that the first surface 404 may be configured to extend to a first height h1 in the first direction 1. Correspondingly, the second surface 406 may be configured extend to a second height h2 in the first direction 1. Advantageously, the heights h1 and h2 are different (difference is non-zero) so that either of the surfaces is higher than the other one. In the exemplary configuration of FIG. 7, the first conductor 400 has been down-etched to be considerably lower than the second conductor 402.

In a gyroscope structure, the spring structures are configured to limit the extent of the primary oscillation below specific maximum amplitude for the primary oscillation of the seismic mass in the direction perpendicular to the plane of masses. Advantageously, the first and second conductors that provide a balancing force in one direction are configured such that the overlap area of the surfaces is at maximum when the amplitude of the out-of-plane movement is at minimum, and the overlap area of the surfaces is at minimum when the amplitude of the out-of-plane movement is at maximum. This is achieved with the configuration of FIG. 7 such that the first conductor and the second conductor extend to the first direction from a same plane, and the difference between the first height h1 and the second height h2 is equal or more than this designed maximum amplitude. This guarantees that during operation, an edge 700 of the first surface 404 does not go beyond an edge 702 of the second surface 406. During a cyclic primary motion of the seismic mass, the overlap area between the first surface and the second surface changes only in half of the cycle, modulating a balancing force only in appropriate phase with the primary motion. It is alternatively possible to achieve the desired phasing by electrically reversing the potential difference between the first conductor and the second conductor according to the frequency of the primary motion of the seismic mass, but the mechanical construction illustrated in FIG. 7 is far more robust and simpler to implement.

When the first surface 404 is lower than the second surface 406, as shown in FIG. 7, the electrostatic force is modulated in a half-cycle of the primary motion. It is also possible to down-etch the second conductor 406 such that the first surface 404 is higher than the second surface 406. In such a case the electrostatic force is modulated in another half-cycle of the primary motion A gyroscope structure may comprise at least one quadrature compensation element, disclosed herein. Advantageously, in a gyroscope structure where the primary motion of the seismic mass is rotary oscillation about an axis of rotation, at least one quadrature compensation element may be arranged to either side of the rotation axis. The quadrature compensation elements in opposite sides of the rotation axis may be applied as a pair, one of which modulates the electrostatic force in a positive second direction during one half-cycle of the primary motion and the other one of which modulates the electrostatic force in a negative second direction during the other half-cycle of the primary motion. The opposite quadrature compensation elements may be used to generate jointly rotary electrostatic forces that provide a modulated in-plane compensation during the whole cycle of the primary motion.

Figure 8:
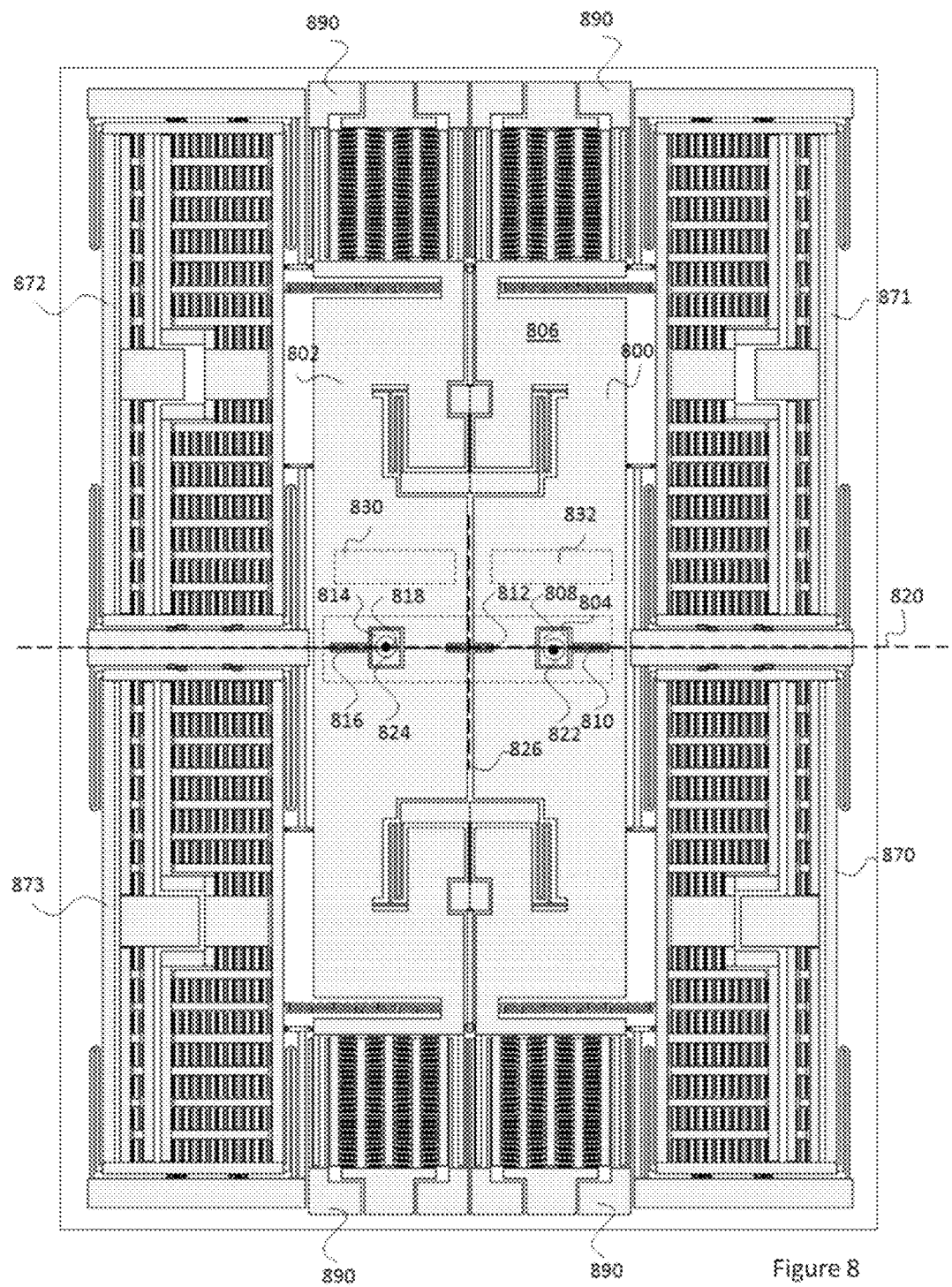
FIG. 8 shows an embodiment where the gyroscope structure has two seismic masses.

The principle is advantageous also in a gyroscope structure that includes two or more seismic masses. FIG. 8 shows an embodiment where the gyroscope structure includes a first seismic mass 800 and a second seismic mass 802. The gyroscope structure includes also a first spring structure 804 for suspending the first seismic mass 800 and the second seismic mass 802 on a body element of the gyroscope. The first spring structure 804 may be configured to suspend the first seismic mass 800 and the second seismic mass 802 into a parallel position such that the plane of the first seismic mass 800 and the plane of the second seismic mass 802 form a suspension plane of masses 806 (later: plane of masses). The plane of masses 806 is a reference plane formed by the seismic masses 800, 802 suspended at their initial designed position when no added external forces act upon them. It is understood that under varying conditions and during operation of the gyroscope, the seismic masses, as such, may later individually move and deform out of the plane of masses 806.

As shown in FIG. 8, the elements of the first spring structure 804 are advantageously within the planar forms of the first seismic mass 800 and the second seismic mass 802. The first spring structure 804 may include a first anchor point 808 within the plane of the first seismic mass 800. The first anchor point 808 refers to an element suitable for attaching the first seismic mass 800 to another body element of the gyroscope, for example to an underlying substrate and/or to a covering cap. The first anchor point 808 may be, for example, a region patterned into the volume plane of the first seismic mass 800 by removing a material of the seismic mass from the perimeter of the region. The first spring structure 804 may include also a first spring assembly 810 attached to the first anchor point 808 and the first seismic mass 800. The first spring assembly 810 may be configured to enable rotary oscillation of the first seismic mass 800 about a first excitation axis 812 that is in the plane of masses 806. The first spring assembly 810 may include, for example, a first beam-formed spring patterned into the plane of the first seismic mass 800 to extend between the first anchor point 808 and the first seismic mass 800. When the first seismic mass 800 during operation oscillates about the first excitation axis 812, the beam-formed spring may twist torsionally between the first anchor point 808 and the first seismic mass 800.

Correspondingly, the first spring structure 804 may include a second anchor point 814 within the plane of the second seismic mass 802. The second anchor point 814 refers to an element suitable for attaching the second seismic mass 802 to another body element, for example to an underlying substrate and/or to a covering cap. The second anchor point 814 may also be, for example, a region patterned into the volume plane of the second seismic mass 802 by removing a material of the seismic mass from the perimeter of the region. The first spring structure 804 may include also a second spring assembly 816 attached to the second anchor point 814 and the second seismic mass 802. The second spring assembly 816 may be configured to enable rotary oscillation of the second seismic mass 802 about a second excitation axis 818 that is in the plane of masses 806. The second spring assembly 816 may include, for example, a second beam-formed spring patterned into the plane of the second seismic mass 802 to extend between the second anchor point 814 and the second seismic mass 802. When the second seismic mass 802 during operation oscillates about the second excitation axis 818, the beam-formed spring may twist torsionally between the second anchor point 814 and the second seismic mass 802. It is noted that the beam-formed spring is only an exemplary structure for the first and second spring assemblies. Other forms may be applied within the scope. For example, a circumferential spring structure surrounding a respective anchor point may be applied for the purpose, as well.

As shown in FIG. 8, the first excitation axis 812 and the second excitation axis 818 are aligned to form a common primary axis 820. The common primary axis 820 may traverse the first anchor point 808 and the second anchor point 814 such that the primary movement includes seesaw type of movement of opposite ends of the seismic masses in relation to the common primary axis 820.

In the first spring structure 804, the first spring assembly 810 enables also rotary oscillation of the first seismic mass 800 about a first detection axis 822 that crosses the plane of the first seismic mass 800 and is perpendicular to the plane of masses 806. Correspondingly, the second spring assembly 816 enables also rotary oscillation of the second seismic mass 802 about a second detection axis 824 that is perpendicular to the plane of masses 806. In the exemplary case of beam-formed springs, the beam spring undergoes in-plane bending and thereby facilitates the in-plane rotary oscillation of the respective seismic mass. The first detection axis 822 and the second detection axis 824 are separated from each other by a non-zero distance. Advantageously the detection axes 822, 824 are symmetrically positioned in respect of a centerline 826 between the seismic masses 800, 802.

The sensor structure includes also excitation means that are configured to drive the first seismic mass 800 and the second seismic mass 802 to oscillate about the common primary axis 820. The first excitation means may include a first mass electrode 830 that is configured to move with the first seismic mass 800, and a second mass electrode 832 that is configured to move with the second seismic mass 802. The electrodes 830, 832 may interact electrically with an electrode or electrodes in the cap or the substrate, and as a result of this electrical interaction induce their respective seismic masses 800, 802 into rotary oscillation about the common primary axis 820.

Figure 1:
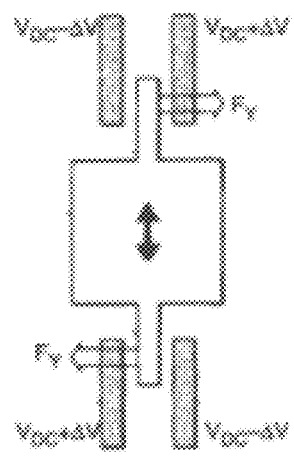
FIG. 1 illustrates a prior art configuration for electrostatic quadrature suppression.

In FIG. 1, the exemplary first excitation means where the seismic mass itself is formed of conductive material and interacts with the stator electrodes 830, 832 (projections of the conductors shown in FIG. 8) inside the cap. It is understood that other positions and other excitation structures capable of creating the specified out-of-plane directed excitation force to a seismic mass may be applied within the scope. For example, a first mass electrode may be configured to move with the first seismic mass 800, and a second mass electrode may be configured to move with the second seismic mass 802. The electrodes may be configured to interact electrically with an electrode or electrodes attached to the cap or the substrate, and as a result of this electrical interaction induce their respective seismic masses 800, 802 into rotary oscillation about the common primary axis 820. Also piezoelectrical excitation may be applied. Other corresponding structures are well known to a person skilled in the art, and will not be discussed in detail herein.

In order to enable double differential detection, the rotary oscillation of the first seismic mass 800 and the rotary oscillation of the second seismic mass 802 may be coupled into anti-phase movement. Anti-phase movement refers here to oscillatory motion of two seismic masses, wherein the seismic masses oscillate with the same, but in different phases. Advantageously, the seismic masses oscillate in opposite phases. The seismic masses 800, 802 may be connected to each other by a coupling spring 880. The coupling spring 880 is advantageously configured to twist along the common primary axis 820 under the rotary oscillations of the seismic masses 800, 802 in the primary motion, and to bend in the plane of masses 806 under the rotary oscillations of the seismic masses 800, 802 in the secondary motion. The coupling spring 880 thereby couples the detected motions of the seismic masses into an anti-phase differential mode that rejects common-mode deflection of the masses, caused by external angular shocks. The coupling thus ensures exceptionally stable operation even in mechanically harsh environments.

As discussed earlier, the secondary motion that corresponds with the detected angular motion takes place in the second direction, i.e. the direction of the plane of masses 806. Detection of motion in this direction may be implemented with comb structures that are inherently quite stable and offer various ways to deal with mechanical deformations due to package induced stresses. The gyroscope structure may include detection means 870, 871, 872, 873, configured to detect the rotary oscillation of the first seismic mass 800 about the first detection axis 812 and the rotary oscillation of the second seismic mass 802 about the second detection axis 818.

As shown in FIG. 8, the gyroscope structure may include one or more quadrature compensation elements 890, disclosed above with FIGS. 1 to 7. In the exemplary gyroscope structure of FIG. 8, each of the seismic masses 800, 802 has a planar form that extends rectilinearly in the direction of the plane of masses, and the primary oscillation is rotary oscillation of the seismic mass about the common primary axis 820. The common primary axis 820 is parallel to the two opposite sides of each of the seismic masses 800, 802 and divides them into two parts. In order to maximize the compensating force to a seismic mass 800, 802, a compensating element 890 may be arranged to an end part of the seismic mass 800, 802. In an end of the seismic masses the distance to the primary axis is the largest, which results correspondingly to the maximum amplitude of the primary motion and thereby to the maximum control of the compensating force. When the out-of-plane primary motion is not rotary oscillation, the location of the compensating element is not relevant in this aspect.

Figure 9:
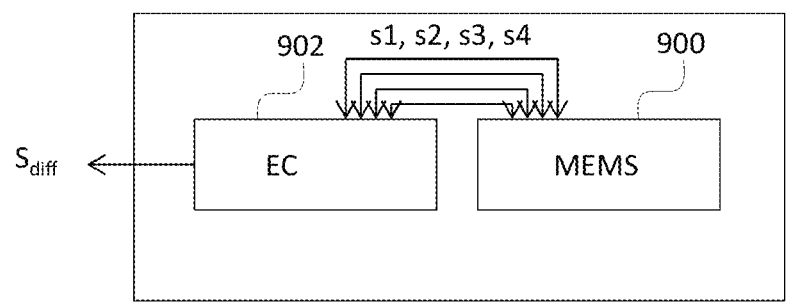
FIG. 9 illustrates an example of a microelectromechanical gyroscope according to the invention.

Embodiments of the invention include also a microelectromechanical gyroscope that includes the claimed gyroscope structure. FIG. 9 illustrates elements of a gyroscope that includes a first component 900 and a second component 902. The first component 900 may include the gyroscope structure of any of FIGS. 1 to 8, and the second component 902 may include an electrical circuit 902 that is connected to exchange electrical signals s1, s2, s3, s4 with the gyroscope structure.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical gyroscope structure, comprising:
    a seismic mass;
    a body element;
    a spring structure suspending the seismic mass to the body element to allow a primary oscillation where at least part of the seismic mass is excited to oscillation in a first direction, and a secondary oscillation where at least part of the seismic mass moves in a second direction that is perpendicular to the first direction, and the seismic mass comprises a surface plane that extends planarly in the second direction and in a third direction, wherein the third direction is perpendicular to the first direction and the second direction;
    a first conductor arranged to move with the seismic mass, the first conductor including a first surface that extends on the seismic mass in the first direction and the third direction;
    a second conductor attached to the body element and including a second surface extending in the first direction and the third direction, and adjacent to the first surface;
    a voltage element arranged to create between the first surface and the second surface a potential difference thereby inducing an electrostatic force in the second direction, which electrostatic force is modulated by the primary oscillation of the seismic mass.

2. The microelectromechanical gyroscope structure of claim 1, wherein
    the first surface extends planarly to a first height in the first direction;
    the second surface extends planarly to a second height in the first direction;
    the first height and the second height are different from each other.

3. The microelectromechanical gyroscope structure of claim 1, wherein the voltage element comprises a direct current bias voltage source connected to the second conductor.

4. The microelectromechanical gyroscope structure of claim 1, wherein
    the spring structure is configured to allow a maximum amplitude for the primary oscillation of the seismic mass in the first direction;
    the difference between the first height and the second height is equal or more than the maximum amplitude.

5. The microelectromechanical gyroscope structure of claim 1, wherein the second surface is higher than the first surface.

6. The microelectromechanical gyroscope structure of claim 1, wherein the first surface is higher than the second surface.

7. The microelectromechanical gyroscope structure of claim 1, wherein the primary oscillation is rotary oscillation of the seismic mass about an axis that is parallel to the surface plane.

8. The microelectromechanical gyroscope structure of claim 1, wherein the primary oscillation is linear oscillation of the seismic mass away from the body element and towards it.

9. The microelectromechanical gyroscope structure of claim 1, wherein the primary oscillation is buckling oscillation of the seismic mass between two parallel axes.

10. The microelectromechanical gyroscope structure of claim 1, wherein
    the surface plane extends rectilinearly in the second direction and in the third direction;
    the seismic mass comprises two first side planes that extend planarly in the first direction and in the third direction;
    the seismic mass comprises two second side planes that extend planarly in the first direction and in the second direction;
    the primary oscillation is rotary oscillation of the seismic mass about a rotation axis that is parallel to the second side planes and that divides the seismic mass into two parts;
    the second conductor is adjacent to the first side plane and the distance from the second conductor to the rotation axis is greater than the distance to the first side plane in the same part of the seismic mass.

11. The microelectromechanical gyroscope structure of claim 1, wherein the second conductor comprises at least one elongated beam, a surface of the elongated beam of the second conductor being aligned with the first surface of the first conductor in the seismic mass.

12. The microelectromechanical gyroscope structure of claim 1, wherein the first conductor comprises at least one elongated beam and the second conductor comprises at least one elongated beam, a surface of the elongated beam of the first conductor being aligned with a surface of the elongated beam of the second conductor.

13. The microelectromechanical gyroscope structure of claim 12, wherein the second conductor comprises two elongated beams aligned to each other and attached to a distance from each other to accommodate the elongated beam of the first conductor between them.

14. The microelectromechanical gyroscope structure of claim 12, wherein that
the first conductor and the second conductor comprise a plurality of elongated beams;
elongated beams of the first conductor are aligned to each other to form a first comb structure and elongated beams of the second conductor are aligned to each other to form a second comb structure;
the first comb structure and the second comb structure are coupled to form a periodic pattern of parallel in-plane electrodes.

15. The microelectromechanical gyroscope structure of claim 14, wherein the elongated beams of the first comb structure and the second comb structure extend parallel to the third direction.

16. The microelectromechanical gyroscope structure of claim 14, wherein the elongated beams of the first comb structure and the second comb structure extend parallel to the second direction.

17. The microelectromechanical gyroscope structure of claim 1, wherein the microelectromechanical gyroscope structure comprises
a first seismic mass and a second seismic mass;
the spring structure suspending the seismic masses to the body element and allowing rotary oscillation of the first seismic mass and the second seismic mass about a common primary axis parallel to the second direction;
the spring structure enables also rotary oscillation of the first seismic mass about a first detection axis that is parallel to the first direction;
the second spring assembly enables also rotary oscillation of the second seismic mass about a second detection axis that is parallel to the first direction;
the first detection axis and the second detection axis are separated by a non-zero distance.

18. The microelectromechanical gyroscope structure of claim 17, wherein each of the first seismic mass and the second seismic mass is provided with at least one compensating element formed of a first conductor, a second conductor and a control element.

19. A gyroscope comprising the microelectromechanical gyroscope structure of claim 1.

* * * * *